US 6,556,349 B2

(12) United States Patent
Cox et al.

(10) Patent No.: US 6,556,349 B2
(45) Date of Patent: Apr. 29, 2003

(54) VARIABLE FOCAL LENGTH MICRO LENS ARRAY FIELD CURVATURE CORRECTOR

(75) Inventors: James Allen Cox, New Brighton, MN (US); Bernard S. Fritz, Eagan, MN (US)

(73) Assignee: Honeywell International Inc., Morristown, NJ (US)

(*) Notice: Subject to any disclaimer, the term of this patent is extended or adjusted under 35 U.S.C. 154(b) by 0 days.

(21) Appl. No.: 09/749,296

(22) Filed: Dec. 27, 2000

(65) Prior Publication Data

US 2003/0011888 A1 Jan. 16, 2003

(51) Int. Cl.[7] .............................................. G02B 27/10
(52) U.S. Cl. ...................................... 359/626; 359/621
(58) Field of Search ................................ 359/618, 619, 359/620, 621, 622, 623, 624, 625, 626, 628, 455, 718

(56) References Cited

U.S. PATENT DOCUMENTS

| 5,073,041 A | 12/1991 | Rastani ........................ 385/33 |
| 5,245,622 A | 9/1993 | Jewell et al. ................. 372/45 |
| 5,325,386 A | 6/1994 | Jewell et al. ................. 372/50 |
| 5,345,336 A | 9/1994 | Aoyama et al. ............ 359/628 |
| 5,349,394 A | * 9/1994 | Freeman et al. ......... 351/160 R |
| 5,401,968 A | 3/1995 | Cox ............................ 250/353 |
| 5,439,621 A | 8/1995 | Hoopman |
| 5,493,143 A | 2/1996 | Hokari ........................ 257/432 |
| 5,526,182 A | * 6/1996 | Jewell et al. ............... 359/621 |
| 5,633,527 A | 5/1997 | Lear ............................ 257/432 |
| 5,707,684 A | 1/1998 | Hayes et al. ................ 427/162 |
| 5,812,581 A | 9/1998 | Cox ............................ 372/50 |
| 5,877,040 A | 3/1999 | Park et al. .................... 438/70 |
| 5,902,997 A | * 5/1999 | Kropp ......................... 250/216 |
| 5,966,399 A | 10/1999 | Jiang et al. ................... 372/96 |
| 6,021,003 A | 2/2000 | Katsuki et al. |
| 6,043,481 A | * 3/2000 | Tan et al. .................... 250/216 |
| 6,056,448 A | 5/2000 | Sauter et al. ................. 385/92 |
| 6,062,476 A | 5/2000 | Stern et al. ............ 235/462.35 |
| 6,073,851 A | 6/2000 | Olmstead et al. |
| 6,246,530 B1 | * 6/2001 | Matsuura .................... 359/719 |
| 6,301,363 B1 | * 10/2001 | Mowry, Jr. ................... 380/51 |

FOREIGN PATENT DOCUMENTS

EP        0 840 502 A    5/1998

OTHER PUBLICATIONS

Hessler, T., et al., "Microlens arrays with special variation of the optical functions", article in *Pure and Applied Optics*, vo. 6, No. 6, 1997, pp. 673–681.

(List continued on next page.)

Primary Examiner—Georgia Epps
Assistant Examiner—Saeed Sayrafi
(74) Attorney, Agent, or Firm—Andrew A. Abeyta; John G. Shudy, Jr.; Brian N. Tufte

(57) ABSTRACT

The present invention provides an optical system that includes an array of opto-electronic devices, an array of micro lenses, and a fore optic. The array of opto-electronic devices lie substantially along a plane, but the fore optic has a non-planar focal field. To compensate for the non-planar focal field of the fore optic, each opto-electronic device has a corresponding micro lens. Each micro lens has a focal length and/or separation distance that compensates for the non-planar focal field of the fore optic. As a result, light that is provided by the fore optic is reconfigured by the micro lenses to be substantially focused along the plane of the array of opto-electronic devices.

8 Claims, 8 Drawing Sheets

OTHER PUBLICATIONS

PCT International Search Report, dated Oct. 18, 2002, relative to International application PCT/US 01/50094, the foreign counterpart of the subject US patent application.

International Journal of High Speed Electronics and Systems, vol.; 5, No. 4, Dec. 1994, "High Performance Producible Vertical–Cavity Lasers for Optical Interconnects", Morgan, pp. 65–95.

The International Society for Optical Engineering, Reprinted from Miniature and Micro–Optics and Microme chanics, vol. 1992, (1993), "Vertical Cavity Surface Emitting Lasers: The Next Generation", Robert A. Morgan, pp. 64–89.

Optical Enginnering, Mar. 1990, vol. 29, No. 3, "Surface–Emitting Microlasers for Photonic Switching and Interchip Connections", J.L. Jewell et al., pp. 210–214.

Honeywell, Micro–Optics Fabrication Techniques, dated prior to Dec., 2000.

Honeywell, Fast Net Concept: Distinguishing Features, dated prior to Dec., 2000.

* cited by examiner

VARIABLE FOCAL LENGTH MICRO LENS ARRAY FIELD CURVATURE CORRECTOR

TECHNICAL FIELD OF THE INVENTION

This invention relates to the field of opto-electronic devices and more particularly to opto-electronic devices with optical micro lenses.

BACKGROUND OF THE INVENTION

Opto-electronic devices include both emitters and detectors. An opto-electronic emitter is a device that converts an electrical signal into an optical signal. Examples of opto-electronic emitters include light emitting diodes (LEDs) and vertical cavity surface emitting lasers (VCSELs). An opto-electronic detector is a device that converts an optical signal into an electrical signal. Examples of opto-electronic detectors include Charge Coupled Devices (CCDs) and resonant cavity photodetectors (RCPDs).

The development of integrated opto-electronic devices has made it possible to fabricate multiple opto-electronic devices on a single substrate to form two-dimensional arrays. These two dimensional arrays are useful in a wide variety of applications. For instance, two dimensional arrays of CCDs are often used to in digital cameras and imaging equipment, while two-dimensional arrays of VCSELs and RCPDs are often used for communication applications for switching optical signals and interfacing optical signals with electronic circuits. Techniques for fabricating and using CCDs, VCSELs, LEDs, and RCPDs are well know to those skilled in the art.

When opto-electronic devices are used in an array as emitters or detectors, an external fore lens is often employed to focus or collimate the beams of light to or from the array. Unfortunately, aberrations are often associated with the fore lens. One common aberration is a curvature of field aberration, which causes the light to be focused on a curved surface, such as a sphere, rather than on the surface of a plane. Other more complex aberrations are also common. Prior art methods for compensating for field curvature include implementing a refractive field-flatting element. Unfortunately, these refractive field-flattening elements are both costly and bulky. Therefore, a need exists for an economical and compact method for reducing the curvature of field associated with the fore lens in an optical system.

SUMMARY OF THE INVENTION

The present invention overcomes many of the disadvantages of the prior art by providing a method and apparatus for compensating for an aberration, such as a curvature of field, of a fore lens in a system that includes one or more opto-electronic devices.

In one illustrative embodiment, the present invention contemplates an optical system that includes an array of opto-electronic devices that are provided substantially in a plane. The opto-electronic devices in the array may be fabricated on the same substrate or fabricated individually and then bonded or electrically connected to a substrate to form the array. The array includes a fore optic, such as a lens, provided above the array of opto-electronic devices for collimating or focusing the light traveling to or from the array. The fore optic typically has a non-planar focal field and thus focuses or collimates the light substantially along a non-planar surface, such as a sphere or other more complex image surface, rather than along the plane of the opto-electronic devices.

To compensate for the non-planar focal field of the fore optic, an illustrative embodiment of the present invention provides a micro lens for each opto-electronic device. In this embodiment, the micro lenses are preferably substantially co-planar, with each micro lens having a focal length that varies in a manner necessary to relay or focus the opto-electronic device aperture onto the non-planar fore optic image surface. In one embodiment, the focal length of each micro lens depends on the location of the micro lenses relative to the optical axis of the fore optics.

In another illustrative embodiment, the micro lenses are not co-planar. Instead, each micro lens is separated from the fore optic (and thus a corresponding opto-electronic device) by a distance that depends on the location of the micro lens relative to the optical axis of the fore optic. By varying the separation distance between the micro lenses and the fore optic, more of the light that is focused on the non-planar focal field of the fore optic can be captured. In one embodiment, the separation distance between each micro lens and the fore optic is related to, and may track, the non-planar fore optic image surface. Each micro lens may also have a focal length that corresponds to the separation distance between the micro lens and the corresponding opto-electronic device so that the light captured by the micro lens can be effectively relayed or focused to the aperture of the corresponding opto-electronic device.

In one embodiment of the present invention, the array of opto-electronic devices are opto-electronic detectors, such as resonant cavity photo detectors (RCPDs) or charge coupled devices (CCDs). In another embodiment of the present invention, the array of opto-electronic devices are opto-electronic emitters, such as vertical cavity surface emitting lasers (VCSELs) or light emitting diodes (LEDs). In yet another embodiment of the present invention, the array of opto-electronic devices includes a combination of detectors and emitter, such as VCSELs and RCPDs.

Another illustrative embodiment of the present invention includes an optical system that has multiple opto-electronic arrays configured in a two-dimensional array on a substrate. Each opto-electronic array includes a plurality of opto-electronic devices and a corresponding fore optic provided above the opto-electronic array. Each opto-electronic array may be either centered or offset from the optical axis of the corresponding fore optic. In addition, each opto-electronic array may include emitters, detectors, or a combination of emitters and detectors.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
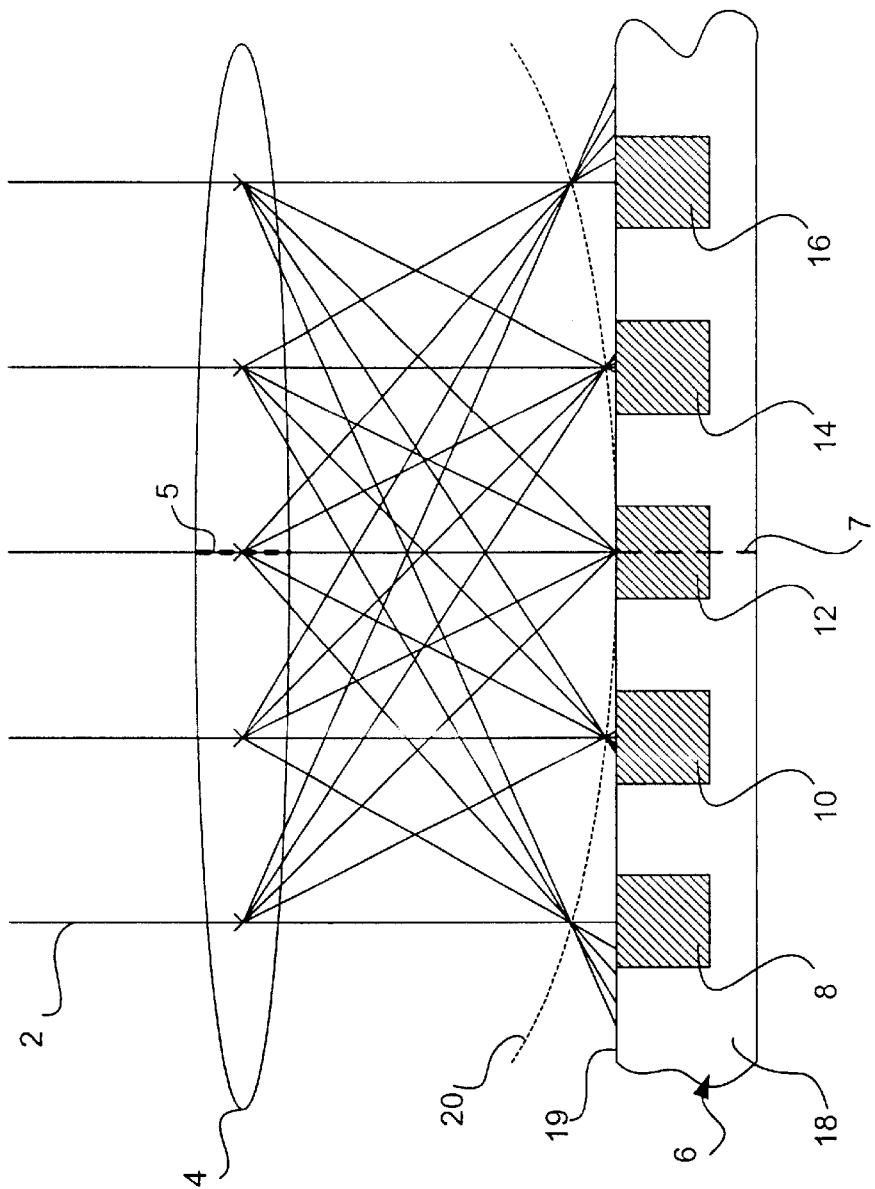
FIG. 1 is a cross-sectional view of an array of opto-electronic detectors with a fore optic provided above the array.

FIG. 1 is a cross-sectional representation of an optical system than includes a fore optic 4, such as a lens, provided above an array of opto-electronic devices 6. In FIG. 1, light rays 2 are incident on fore optic 4. Fore optic 4 transforms light 2 such that it is incident on the array of opto-electronic devices 6. The array of opto-electronic devices 6 includes a center axis 7, which may be centered or offset from optical axis 5 of fore optic 4. The array of opto-electronic devices 6 includes opto-electronic devices 8, 10, 12, 14, and 16 integrated on a common substrate 18. Substrate 18 is preferably a semiconductor substrate such as silicon or GaAs. Opto-electronic devices 8, 10, 12, 14, 16, and 18 may be any type of opto-electronic device know to those skilled in the art, including, for example, CCDs, RCPDs, LEDs, and VCSELs.

Fore optic 4 has optical axis 5 and a non-planar focal field, such as curvature of field 20 substantially centered along optical axis 5. As a result, light rays 2 that are incident on fore optic 4 are not focused on planar surface 19 of the array of opto-electronic devices 6. Instead, and for illustrative purposes, the curvature of field 20 has a spherical shape as shown. When the curvature of field 20 has a spherical shape, the optical signal at the opto-electronic device 12 in the center of the array of opto-electronic devices 6 may be greater than the optical signal at the opto-electronic devices 8 and 16 near the outside of the array of opto-electronic devices. While simple fore optic systems may have "spherical-like" image surfaces, more complex optical systems may have more complex image surfaces, some with both convex and concave regions. For the more complex image surfaces, the optical signal at each of the opto-electronic devices may depend on the location of the opto-electronic device relative to the particular image surface.

Figure 2:
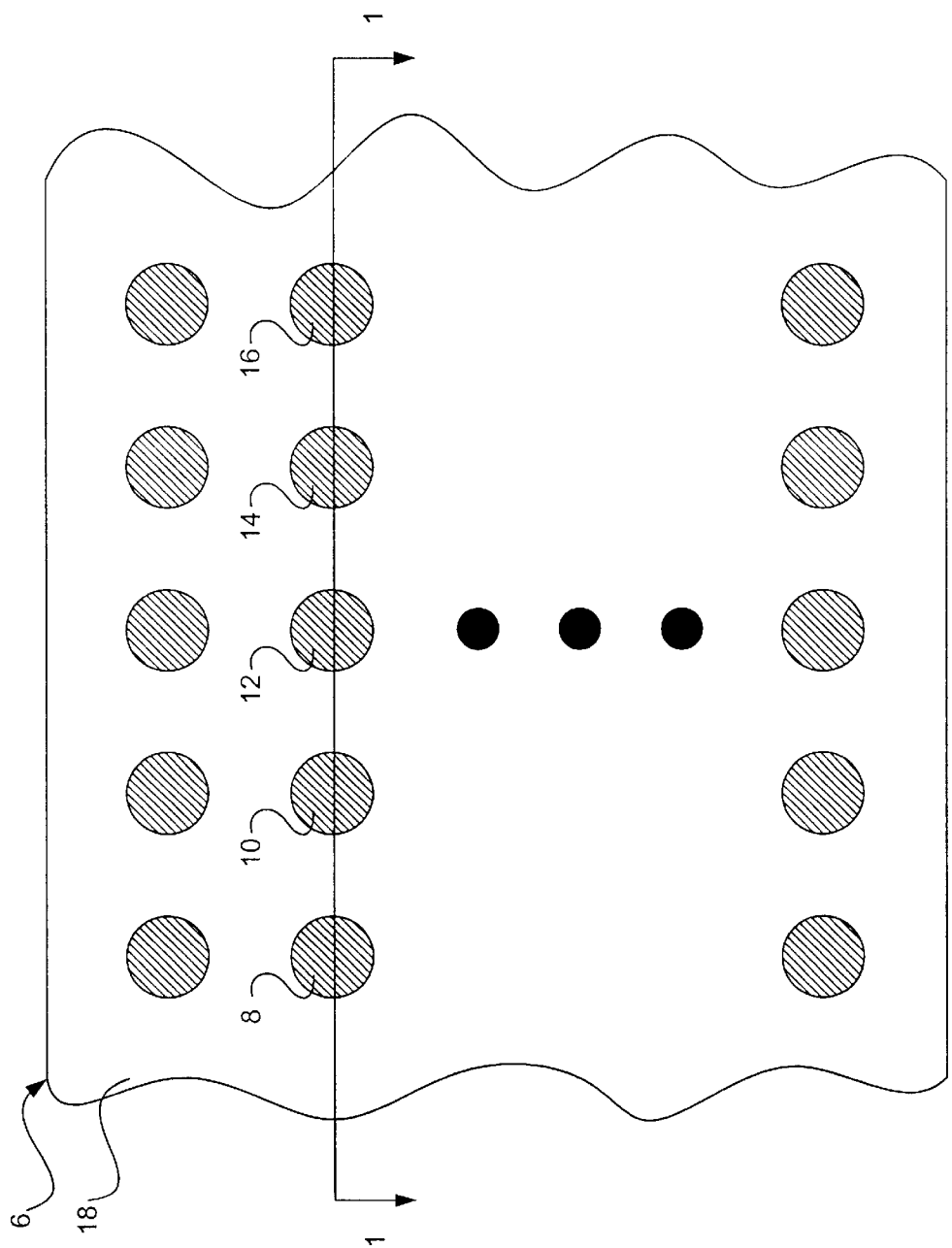
FIG. 2 is a top view of the array illustrated in FIG. 1.

FIG. 2 is a top view of an array of opto-electronic devices such as those discussed in reference to FIG. 1. Line 1—1 represents the line from which the cross-section of FIG. 1 is taken. For illustration purposes, FIG. 2 represents a square two-dimensional array. The present invention, however, is not limited to a square array. Depending on the application, the detectors can be fabricated in any suitable one or two-dimensional configuration.

Figure 3:
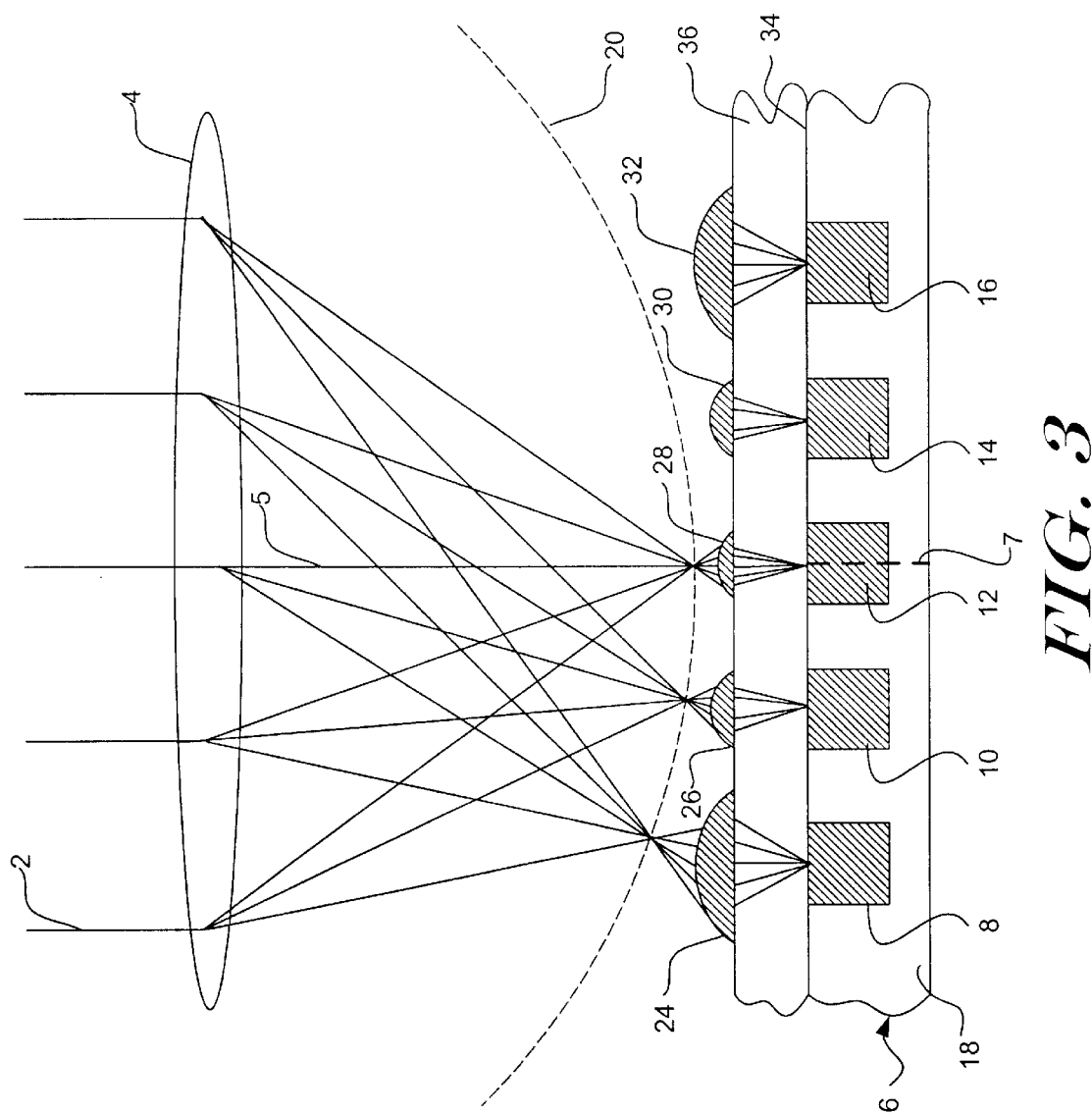
FIG. 3 is a cross-sectional view of an optical system in accordance with the present invention, which includes an array of coplanar micro lenses, each having a corresponding opto-electronic device.

FIG. 3 is a cross-sectional representation of an optical system that includes an array of opto-electronic devices in accordance with the present invention. The embodiment shown in FIG. 3 is similar to that shown in FIG. 1, except a number of co-planar micro lenses 24, 26, 28, 30, and 32 have been added above opto-electronic devices 8, 10, 12, 14, and 16, respectively. In this embodiment, the co-planar micro lenses 24, 26, 28, 30, and 32 are preferably initially fabricated on an optically transparent substrate 36, which is then bonded to the substrate 18 that includes the array of opto-electronic devices 8, 10, 12, 14, and 16. Fore optic 4 collimates or focuses the light rays 2 along an image surface 20 defined by the field of curvature of the fore optic 4.

Each micro lens preferably has a focal length that compensates for the field of curvature of the fore optic 4. When the field curvature of the fore optic 4 lies along a spherical surface 20, as shown in FIG. 2, the focal lengths of micro lenses 24, 26, 28, 30, and 32 may increase monotonically away from central optical axis 5 of fore optic 4. By varying the focal length of each micro lens, the light rays 2 that are transmitted through fore optic 4 may be substantially focused by the micro lenses 24, 26, 28, 30, and 32 to the planar surface 34 of the array of opto-electronic devices 6.

As indicated above, some simple fore optic systems may have a "spherical-like" image surface. However, more complex optical systems may have more complex image surfaces, some with both convex and concave regions. For these more complex surfaces, the optical signal at each of the opto-electronic devices may depend on the location of the opto-electronic device relative to the image surface of the fore optic. To provide compensation for fore optics that have these more complex image surfaces, the focal length of the micro lenses may not necessarily increase monotonically, but may vary according to the particular image surface of the fore optic, preferably so that the aperture of the corresponding opto-electronic device is focused or relayed onto the fore optic image surface.

Figure 4:
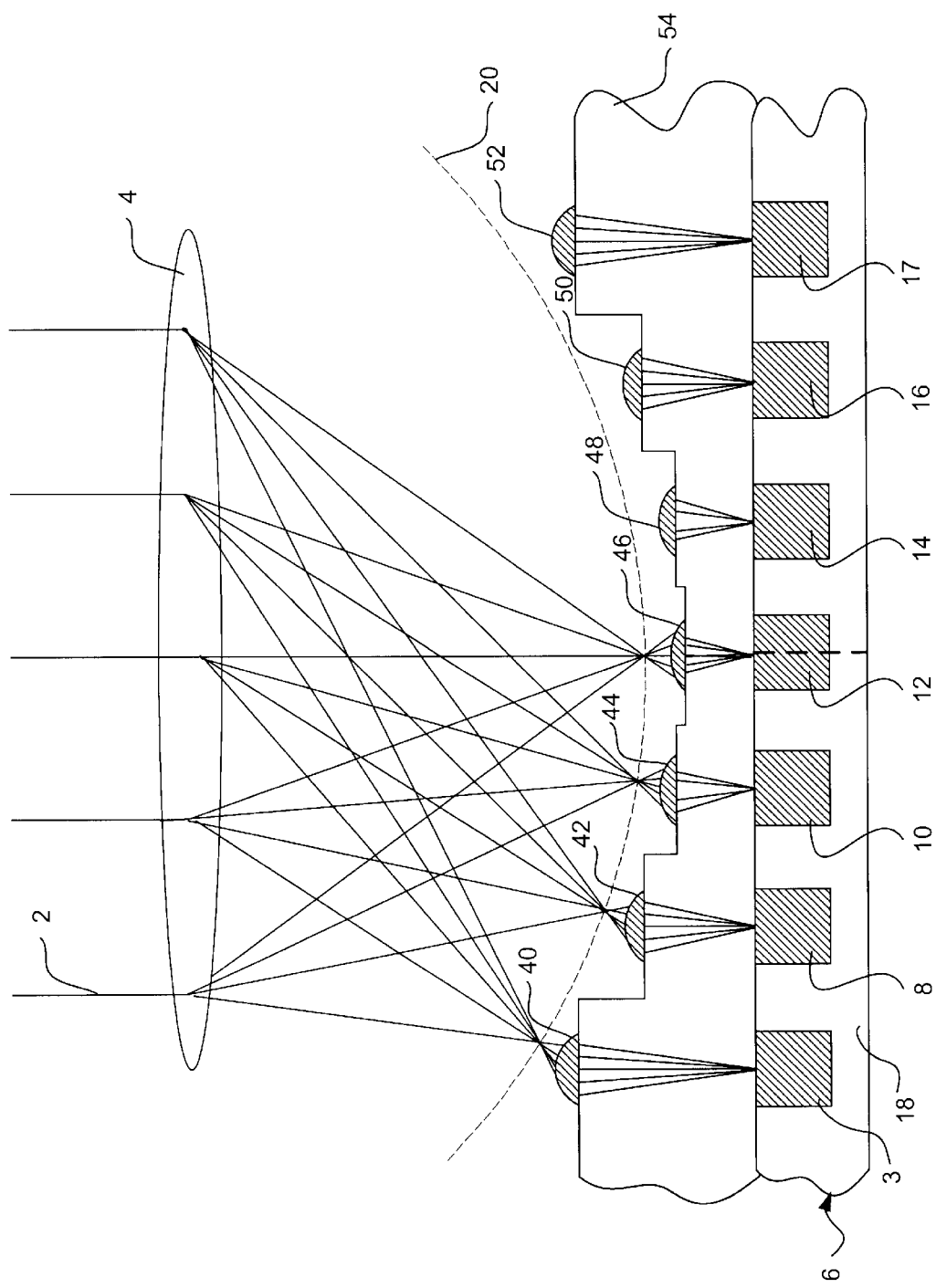
FIG. 4 is a cross-sectional view of another optical system in accordance with the present invention, which includes an array of non-planar micro lenses, each having a corresponding opto-electronic device.

FIG. 4 is a cross-sectional view of another optical system in accordance with the present invention, which includes an array of non-planar micro lenses, each having a corresponding opto-electronic device. The embodiment shown in FIG. 4 is similar to that shown in FIG. 3, except the micro lenses 40, 42, 44, 46, 48, 50 and 52 are non-planar, and have a varying separation distance from the fore optic 4 (and thus the opto-electronic devices 3, 8, 10, 12, 14, 16, and 17 respectively). By varying the separation distance between the micro lenses 40, 42, 44, 46, 48, 50 and 52 and the fore optic 4, more of the light that is focused on the non-planar focal field 20 of the fore optic 4 can be captured by the micro lenses. Preferably, each micro lens 40, 42, 44, 46, 48, 50 and 52 has a focal length that corresponds to the separation distance between the micro lens and the corresponding opto-electronic device so that the light captured by the micro lens can be relayed or focused at the aperture of the corresponding opto-electronic device.

The embodiment shown in FIG. 4 has the benefit of moving the micro lenses closer to the fore optic image surface, thereby capturing more of the light coming to focus at the image surface. This may permit each of the micro lenses to have substantially the same width or diameter, as shown. The embodiment shown in FIG. 3 may not necessarily permit a constant micro lens width, which may be a detriment when the width or diameter of some of the micro lenses approach or exceed the pitch of the opto-electronic devices.

The non-planar micro lenses 40, 42, 44, 46, 48, 50 and 52 of FIG. 4 are preferably initially fabricated on an optically transparent substrate 54, which is then bonded to the substrate 18 that includes the array of opto-electronic devices 3, 8, 10, 12, 14, 16 and 17. A number of methods for providing a varying separation distance between the micro lens 40, 42, 44, 46, 48, 50 and 52 and the array of opto-electronic devices 3, 8, 10, 12, 14, 16 and 17 are contemplated. Some of the methods use an additive process, such as a deposition or growth process. Other methods use a subtractive process.

Figure 5A:
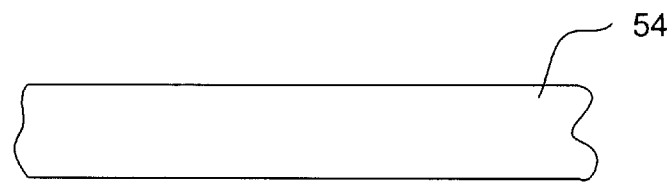
FIGS. 5A–5E are schematic diagrams showing an illustrative method for fabricating the non-planar micro lenses of FIG. 4.
Figure 5B:
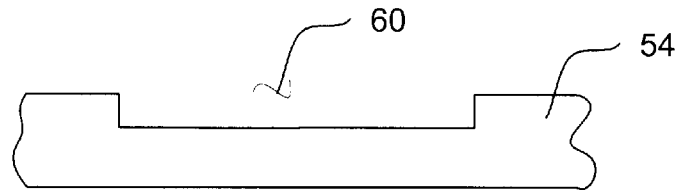
Figure 5C:
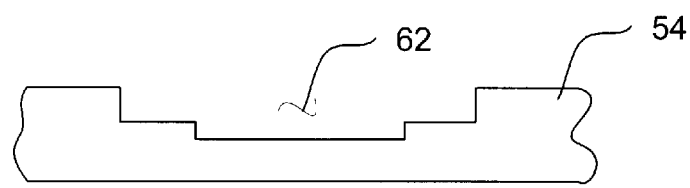
Figure 5D:
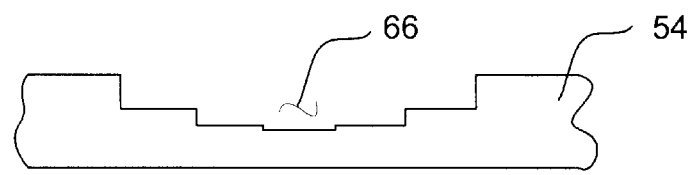
Figure 5E:
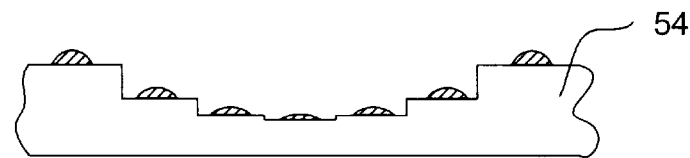

One illustrative method for providing a varying separation distance between the micro lens 40, 42, 44, 46, 48, 50 and 52 and the array of opto-electronic devices 3, 8, 10, 12, 14, 16 and 17 is shown in FIGS. 5A–5E. An optically transparent substrate 54 is provided in FIG. 5A. In FIG. 5B, a first groove or cavity 60 is etched into the top surface of substrate 54, preferably using known methods. The first groove or cavity 60 may provide a surface for forming one or more micro lenses, as further described below. In FIG. 5C, a second groove or cavity 62 may be etched into the bottom surface of the first groove or cavity 60, as shown. The second groove or cavity 62 may provide another lower surface for forming one or more micro lenses. In FIG. 5D, a third groove or cavity 64 may be etched into the bottom surface of the second groove or cavity 62, as shown. The third groove or cavity 64 may provide yet another lower surface for forming one or more micro lenses. Finally, in FIG. 5D, a fourth groove or cavity 66 may be etched into the bottom surface of the third groove or cavity 64. The fourth groove or cavity 66 may provide another lower surface for forming one or more micro lenses. FIG. 5E shows non-planar micro lenses 40, 42, 44, 46, 48, 50 and 52 formed on the various step surfaces etched into the optically transparent substrate 54. The optically transparent substrate 54 shown in FIG. 5E can be used for providing compensation for a fore optic that has a "spherical-like" image surface.

As indicated above, however, some fore optic systems may provide more complex image surfaces. For these systems, it is contemplated that the various steps or surfaces formed in the optically transparent substrate 54, such as shown in FIGS. 5A–5E, may be tailored to provide a suitable separation distance for each micro lens that helps compensate for the non-planar and more complex image surfaces.

It is important to note that the array of opto-electronic devices illustrated in FIGS. 3–4 are not limited to either opto-electronic emitters or opto-electronic detectors exclusively. The optical system can easily be modified to include both emitters and detectors in a single array. One method used to fabricate emitters and detectors is illustrated in U.S. patent application Ser. No. 08/736,803 now U.S. Pat. No. 5,978,401, entitled "Monolithic Vertical Cavity Surface Emitting Laser and Resonant Cavity Photodetector Transceiver," which is incorporated herein by reference. Alternatively, emitters and detectors fabricated separately may be physically and electronically connected to a single substrate. Methods for connecting independent devices on a single substrate may include wire bonding, bump technology, or the like.

Figure 6:
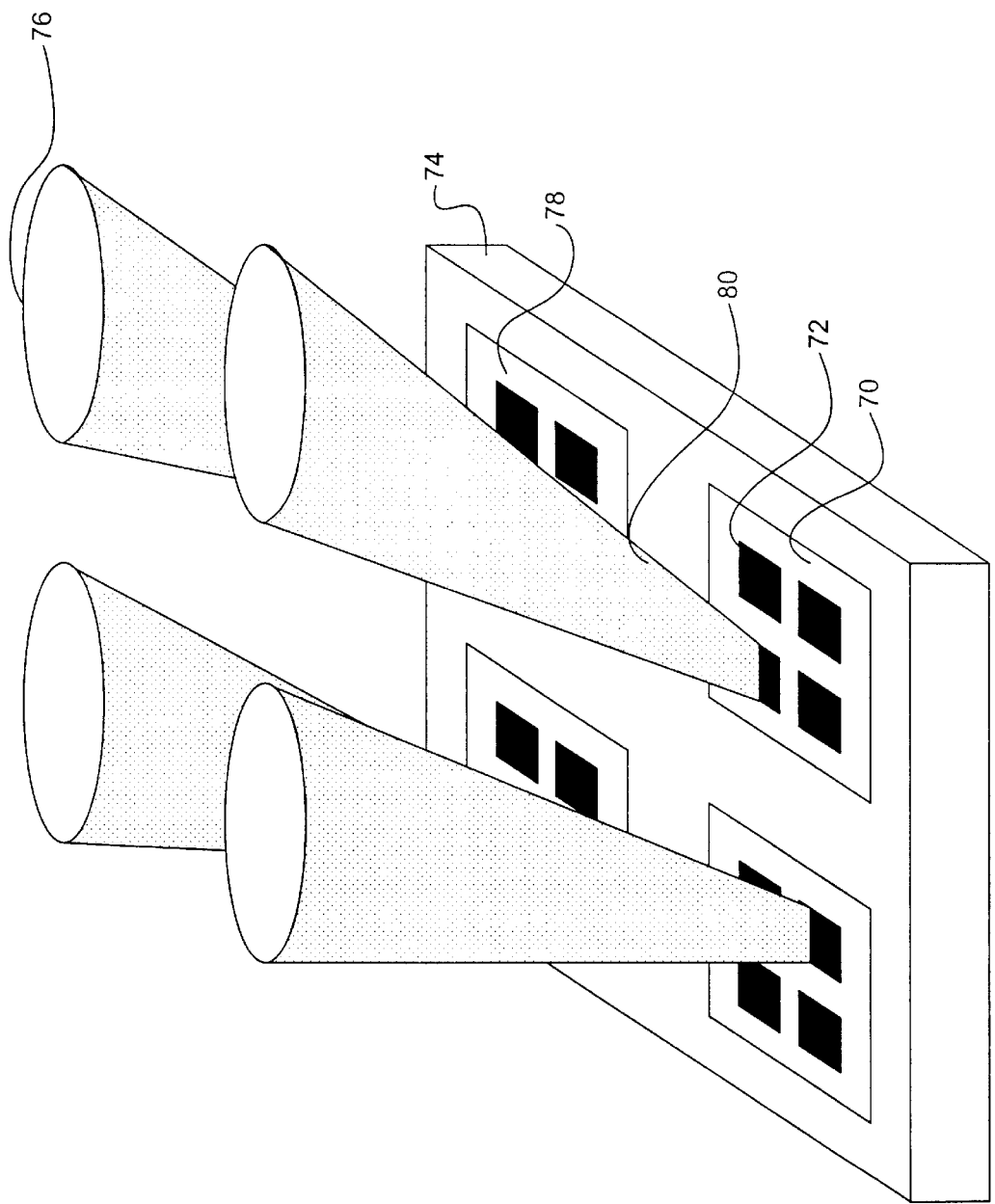
FIG. 6 is a perspective view of yet another optical system of the present invention.

FIG. 6 is a perspective view of yet another optical system of the present invention. In FIG. 6, multiple opto-electronic arrays 70 are provided in a two-dimensional configuration on substrate 74. Each opto-electronic array 70 includes a plurality of opto-electronic devices and a corresponding fore optic 76. Each opto-electronic device 72 in opto-electronic array 70 has a corresponding micro lens (not shown). Each fore optic 76 may have a non-planar focal field, such as a curvature of field. As discussed above with reference to FIGS. 3 and 4, each micro lens can be fabricated to have a corresponding focal length and/or separation distance that compensates for the non-planar focal field of fore optic 76.

In FIG. 6, there are four opto-electronic arrays each including four opto-electronic devices. FIG. 6 is merely illustrative however, and the present invention is not limited to the number or type of arrays and devices shown therein. In any event, multiple opto-electronic arrays 70 may be fabricated on a single substrate, such as substrate 74. Substrate 74 is preferably a semiconductor substrate such as a silicon or gallium arsenide wafer. Alternatively, opto-electronic arrays may be fabricated on an individual substrate 78 that is in turn physically bonded to or electronically connected to substrate 74. An electronic connection to substrate 74 may be provided through the use of bonding technology well know to those skilled in the art, such as wire bonding, bump technology, or the like.

Each opto-electronic array 70 may contain opto-electronic emitters, such as VCSELs or LEDs, opto-electronic detectors, such as RCPDs or CCDs, or a combination of detectors and emitters, such as VCSELs and RCPDs. Therefore, fore optic 76 may provide light 80 both to and/or from opto-electronic array 70. Light 80 provided to fore optic 76 from opto-electronic array 70 may be in turn provided to another optical device (not shown) such as a mirror, lens, optical fiber, or optical detector. Alternatively, light 80 may be provided through fore optic 76 to opto-electronic device 72, for example, from an optical device such as a mirror, lens, optical fiber, or optical emitter.

Figure 7:
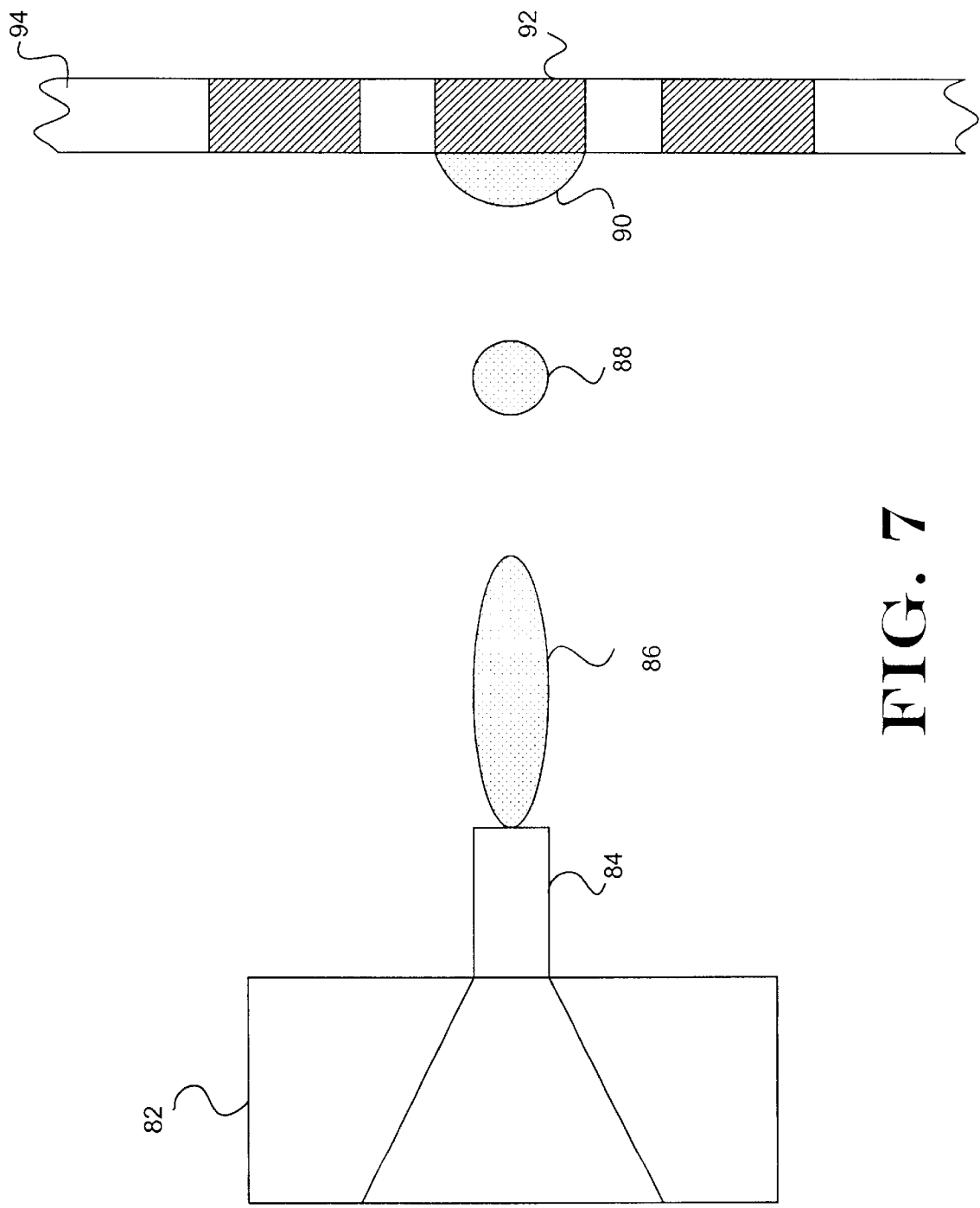
FIG. 7 is a schematic diagram of an illustrative fabrication process for forming the micro lenses.

FIG. 7 is a schematic representation of one method for fabricating the micro lenses used in accordance with the present invention. A print head 82 provides a liquid optical polymer 86 via a nozzle 84. The liquid optical polymer 86 forms a droplet 88, which is provided to an opto-electronic device 92 on a substrate 94 to form a micro lens 90. While this illustrative method shows the micro lens 90 provided directly on the opto-electronic device 92, it is contemplated that the micro lens may be formed on another, preferably optical transparent substrate, which is then mounted or otherwise attached to the substrate 94 so the micro lenses are in registration with the opto-electronic devices, such as device 92.

Figure 8:
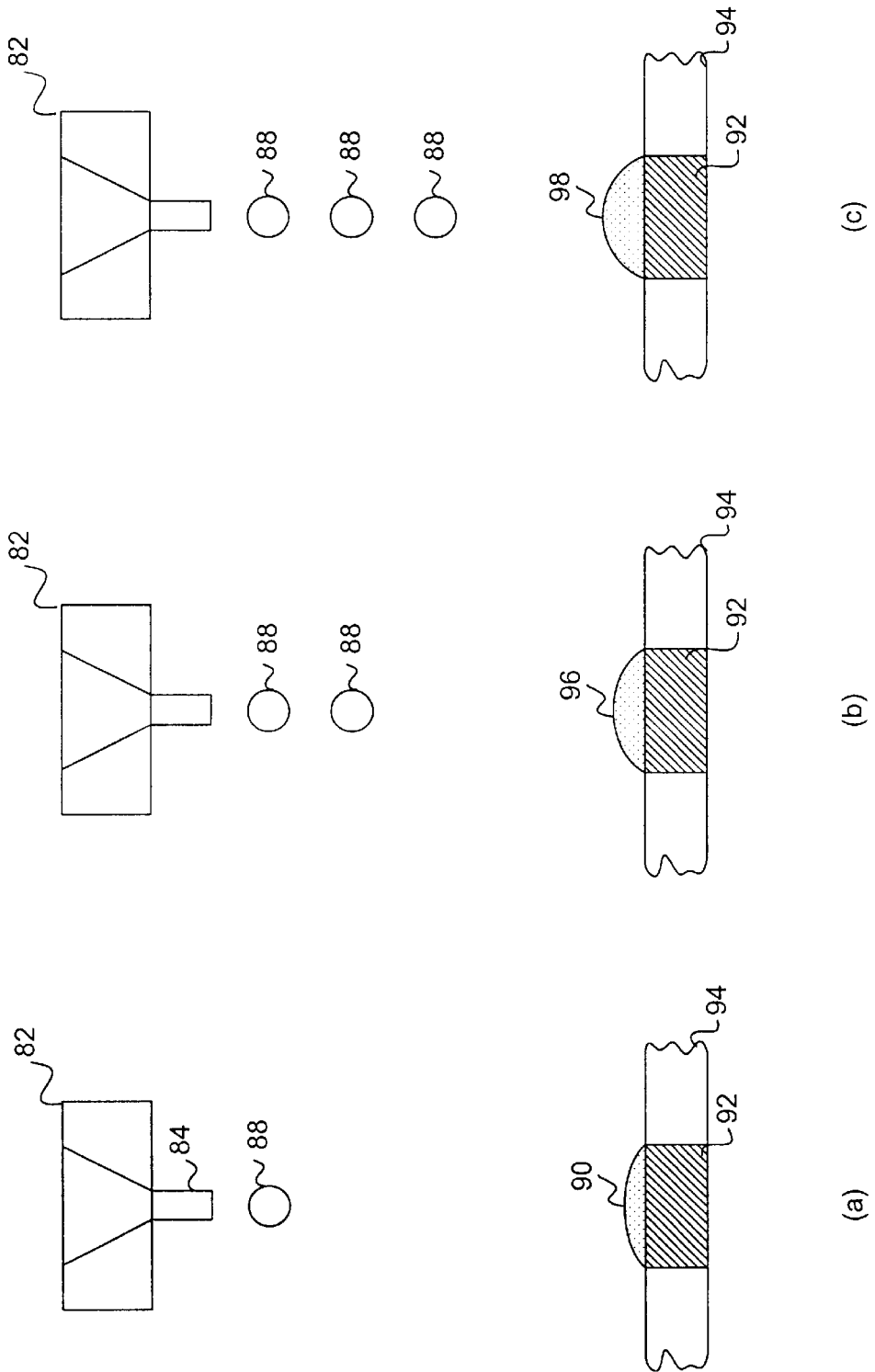
FIGS. 8(a)–(c) are schematic diagrams showing the fabrication of micro lenses with varying focal lengths.

FIGS. 8(a)–(c) are schematic representations of one method for providing micro lenses with different focal lengths across an array. In FIG. 8(a), one droplet 88 is provided to an opto-electronic device 92 to form a micro lens 90. The micro lens 90 has a focal length $f_1$. In FIG. 8(b), two droplets 88 are successively provided to an opto-electronic device to form a micro lens 96. The micro lens 96 has a focal length of $f_2$. In FIG. 8(c), three droplets 88 are successively provided to an opto-electronic device 98 to form a micro lens 98. The micro lens 98 has a focal length of $f_3$, where $f_3<f_2<f_1$. As the number of droplets increases, the focal length of the corresponding micro lens decreases. Therefore, the focal length of the micro lens 98 is less than the focal length of the micro lens 96, which in turn is less than the focal length of the micro lens 90. A more detailed description of one method for forming the micro lenses can be found in U.S. Pat. No. 5,707,684 to Hayes et al., entitled "Method for Producing Micro-Optical Components."

Having thus described the preferred embodiments of the present invention, those of skill in the art will readily appreciate that the teachings found herein may be applied to yet other embodiments within the scope of the claims hereto attached.

What is claimed is:

1. A focal field corrector comprising:
   a first substrate having a first surface on one side that is substantially planar and a second surface on an opposite side that has a plurality of stepped-surfaces, wherein some of the surfaces of the plurality of surfaces are not situated in a plane relative to each other; and
   a plurality of micro lenses wherein each micro lens is situated on a surface of said plurality of surfaces, and each micro lens is situated to compensate for a non-planar focal field of a fore lens to appear substantially planar at the first surface of said first substrate.

2. The focal field corrector of claim 1, wherein said substrate and plurality of micro lenses are substantially optically transparent.

3. The focal field corrector of claim 2 comprising:

a second substrate having a substantially planar first surface; and a plurality of opto-electronic devices situated in the first surface of said second substrate; and wherein the first surface of said first substrate is adjacent to the first surface of said second substrate.

4. The focal field corrector of claim 3, wherein said plurality of opto-electronic devices are emitters and/or detectors.

5. The adjuster of claim 3, wherein:

the first surface of the first substrate is substantially planar; and the second surface of said second substrate is substantially planar.

6. An optical system comprising:

an array of opto-electronic devices provided substantially along a plane; and an array of micro lenses disposed adjacent to the array of opto-electronic devices, at least some of the micro lenses not being situated in the same plane; and wherein the array of opto-electronic devices is fabricated on a first substrate;

the array of micro lenses is fabricated on a second substrate; and the first substrate is adjacent to the second substrate.

7. An optical system according to claim 6, wherein a top surface of the second substrate includes a number of recessed surfaces that are non-planar, each receiving one or more of the micro lenses.

8. A focal field adjuster comprising:

an array of opto-electronic devices situated substantially in a plane on a first substrate and having a focal field;

an array of micro lenses proximate to said array of opto-electronic devices situated partially in a non-planar relationship so as to adjust the focal field;

wherein:

said array of micro lenses are situated on a second substrate;

the second substrate has first and second surfaces;

said array of micro lenses are situated on the first surface of the second substrate;

said array of opto-electronic devices is situated in a first surface of the first substrate; and the second surface of the second substrate is attached to the first surface of the first substrate.

\* \* \* \* \*